United States Patent [19]

Owaki

[11] Patent Number: 5,355,527
[45] Date of Patent: Oct. 11, 1994

[54] RADIO RECEIVER WITH DISPLAY MEMORY AND KEYS FOR DISPLAYING SELECTING, AND STORING STATION FREQUENCIES

[75] Inventor: Masano Owaki, Kanagawa, Japan
[73] Assignee: Sony Corporation, Tokyo, Japan
[21] Appl. No.: 904,583
[22] Filed: Jun. 26, 1992

[30] Foreign Application Priority Data

Jul. 1, 1991 [JP] Japan .................................. 3-186868
Jul. 4, 1991 [JP] Japan .................................. 1-190604

[51] Int. Cl.$^5$ ............................................. H04B 1/16
[52] U.S. Cl. ............................ 455/186.2; 455/158.1; 455/165.1
[58] Field of Search ............... 455/158.1, 158.2, 158.4, 455/158.5, 186.1, 186.2, 185.1, 183.1, 165.1, 166.1, 166.2, 154.1, 179.1, 161.1, 161.2

[56] References Cited

U.S. PATENT DOCUMENTS

| | | | |
|---|---|---|---|
| 4,285,065 | 8/1981 | Priniski | 455/158 |
| 4,870,492 | 9/1989 | Hakamada et al. | 455/186.1 |
| 4,969,209 | 11/1990 | Schwob | 455/186.1 |
| 5,023,938 | 6/1991 | Takegawa et al. | 455/186.1 |
| 5,086,511 | 2/1992 | Kobayashi et al. | 455/186.1 |
| 5,101,508 | 3/1992 | Owaki | 455/186.2 |

FOREIGN PATENT DOCUMENTS

| | | | |
|---|---|---|---|
| 4006427 | 9/1990 | Fed. Rep. of Germany | G09G 3/00 |
| 4021482 | 3/1991 | Fed. Rep. of Germany | H03J 1/06 |

*Primary Examiner*—Reinhard J. Eisenzopf
*Assistant Examiner*—Nguyen Vo
*Attorney, Agent, or Firm*—Lewis H. Eslinger; Jay H. Maioli

[57] ABSTRACT

A radio receiver of a synthesizer type having a PLL adapted to make frequency conversion of a received signal using an oscillated signal by the PLL to thereby achieve channel selection select keys, a register key, a page key, a display and a microcomputer with memories, a central processing unit, and a display driver. One of the memories contains a data table having pages of frequency data, such pages being selected by the central processing unit and displayed on the display by the display driver in response to key input.

4 Claims, 12 Drawing Sheets

ROUTINE 100

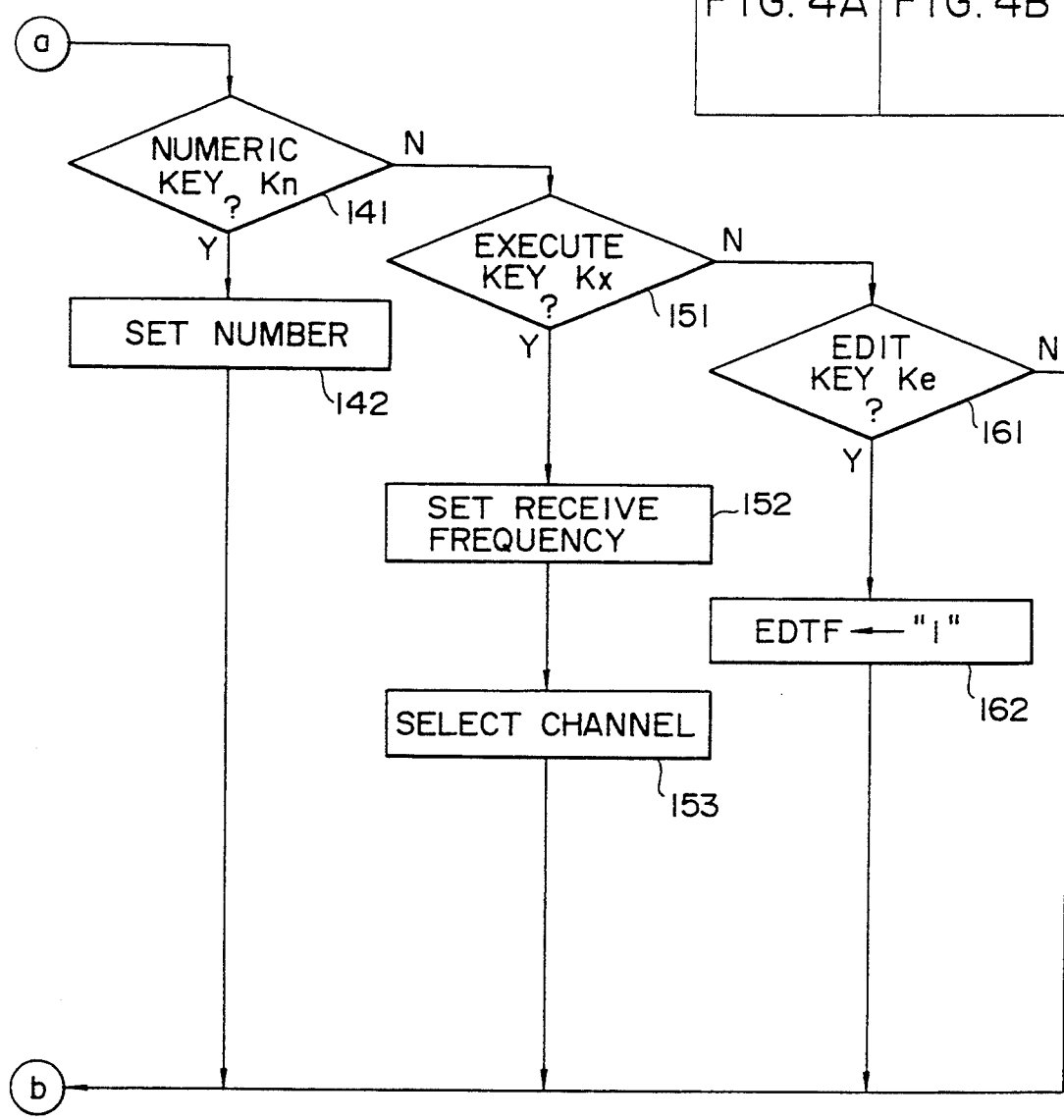

FIG. 5

| | $A_1$ | $A_2$ | $A_3$ | $A_4$ | $A_5$ | FREQUENCY DIVIDING RATIO N / FREQUENCY [kHz] |
|---|---|---|---|---|---|---|
| 1 | 1526 (7180) | 2006 (9585) | 2481 (11955) | 3162 (15360) | 3127 (15185) | |
| 2 | 3144 (15790) | 3122 (15160) | 3175 (15425) | ○ | ○ | |
| 3 | ○ | ○ | ○ | ○ | ○ | |
| 4 | ○ | ○ | ○ | ○ | ○ | |
| 5 | ○ | 594 (2520) | 810 (3600) | 954 (4320) | 1242 (5760) | |
| 6 | ○ | ○ | ○ | ○ | ○ | |
| --- | | | | | --- | DATA TABLE DTBL |
| 20 | ○ | ○ | ○ | ○ | ○ | |

↑K1  ↑K2  ↑K3  ↑K4  ↑K5
[1]  [2]  [3]  [4]  [5]

[◁] Ku   [▷] Kd

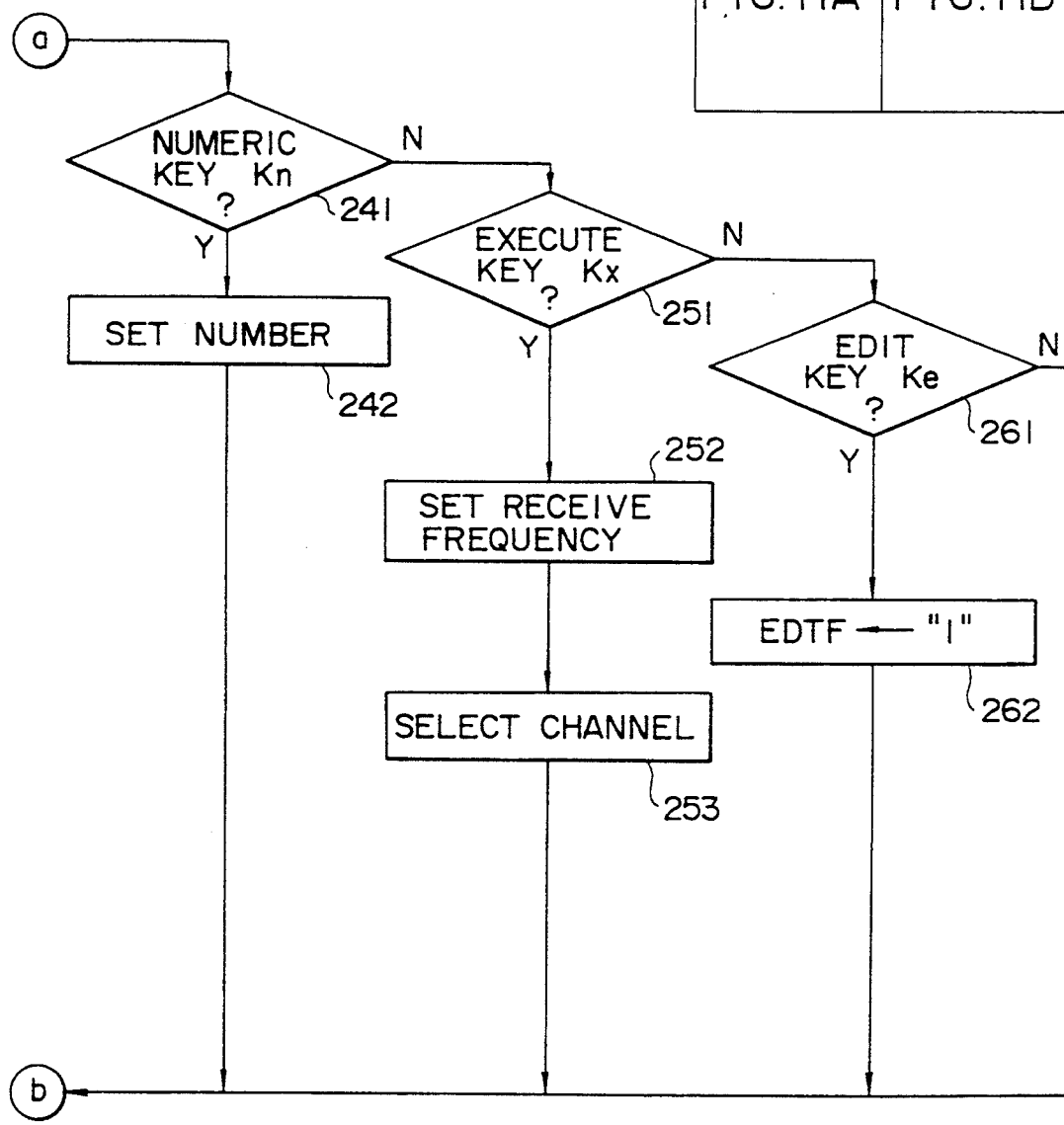

RADIO RECEIVER WITH DISPLAY MEMORY AND KEYS FOR DISPLAYING SELECTING, AND STORING STATION FREQUENCIES

BACKGROUND OF THE INVENTION

1. Field of the Invention

The present invention relates to a radio receiver.

2. Description of the Related Art

A radio receiver of a synthesizer type in general has a presetting function of receive frequencies. For example, the following steps are taken:

1. making a channel selection of a frequency "15290 kHz" by manual operation, and
2. pushing "1" key out of the numeric keys while depressing a "register key". Then, by pushing only the "1" key thereafter, the frequency 15290 kHz can be selected.

Therefore, by using such presetting function at the time of channel selection, a desired broadcasting station can be simply selected by a single touch operation.

In the shortwave broadcasting, since the receive conditions vary with the time of the year or day, such popular broadcasting stations as VOA and BBC are broadcasting their programs at a plurality of different frequencies; they are changing their transmit frequencies varying with the time of the year or day.

Accordingly, in receiving such shortwave broadcasting, it becomes necessary to change the receive frequency according to the receive conditions, depending on the time of the year or day.

Even in the intermediate-frequency broadcasting, some broadcasting stations are broadcasting the same program in different frequencies for the areas where radio wave conditions are not good by using satellite stations to thereby improve the receive conditions in such areas. Further, since the intermediate-frequency broadcasting cannot cover a wide service area, when for example a radio receiver is moved from Tokyo to Osaka, the frequency for receiving the same program becomes quite different.

Thus, a large number of frequencies are used for the radio broadcasting. If all of the frequencies for many kinds of broadcasting have to be preset as described above, it becomes necessary to provide a large number of keys. Then, the control panel of the radio receiver will become full of keys. In addition, it must be remembered then which key was preset to which frequency, and thereby the merit of the presetting is impaired considerably.

Such things not only impair operability but also adversely affect the external appearance of the radio receiver.

SUMMARY OF THE INVENTION

Accordingly, it is an object of the present invention to solve the above mentioned problems and further to facilitate the channel selection by the use of the select key.

In order to attain the above mentioned object, a radio receiver according to the present invention, denoting its parts by reference numerals corresponding to those used in the later described embodiments, is configured to form a synthesizer type radio receiver having a PLL 10 so as to make frequency conversion of a received signal Sr using an oscillated signal So by the PLL 10 to thereby achieve channel selection. Such radio receiver comprises:

a data table DTBL having frequency data for making the channel selection registered therein,
a display means 50,
a page key Ku/Kd,
a plurality of select keys K1 to K5, and
a register key Kr, the data table DTBL being divided into a plurality of pages.

In the described arrangement, it is adapted such that every time the page key Ku/Kd is operated in a first mode, the pages with the frequency data registered therein and one of the pages with no frequency data registered therein of the plurality of pages of the data table DTBL are sequentially selected, every time the page key Ku/Kd is operated in a second mode, all pages of the plurality of pages of the data table DTBL are sequentially selected, and contents of each of the selected pages in the first and second mode are supplied to the display means 50 so that the contents of each of the selected pages are displayed on the display means 50, and further, when one select key of the plurality of select keys K1 to K5 is operated, the frequency data registered at the address corresponding to the operated select key of the select keys K1 to K5 in the page selected by the page key Ku/Kd is read from the address, a receive frequency is set up according to the read frequency data, and when the register key Kr and one select key of the plurality of select keys K1 to K5 are operated, the frequency data with the frequency which is currently received is written at the address corresponding to the operated select key in the page selected by the page key Ku/Kd.

In the first mode, when the page key Ku/Kd is pushed, the pages in which frequency data is registered and one page of the pages in which no frequency data is registered of the data table DTBL are sequentially displayed. Then, by selecting one frequency with one of the select keys K1 to K5 from the frequencies in the displayed page, a channel selection is achieved or the frequency is registered in the displayed page.

In the second mode, when the page key Ku/Kd is pushed, all of the pages of the data table DTBL are selectively displayed. Then, by selecting one frequency with one of the select keys K1 to K5 from the frequencies in the displayed page, a channel selection is achieved or the frequency is registered in the displayed page.

BRIEF DESCRIPTION OF THE DRAWINGS

FIG. 5 is a diagram showing an example of a data table;

DESCRIPTION OF THE PREFERRED EMBODIMENTS

A first embodiment of the present invention will be described below with reference to FIG. 1 to FIG. 8.

Figure 1:
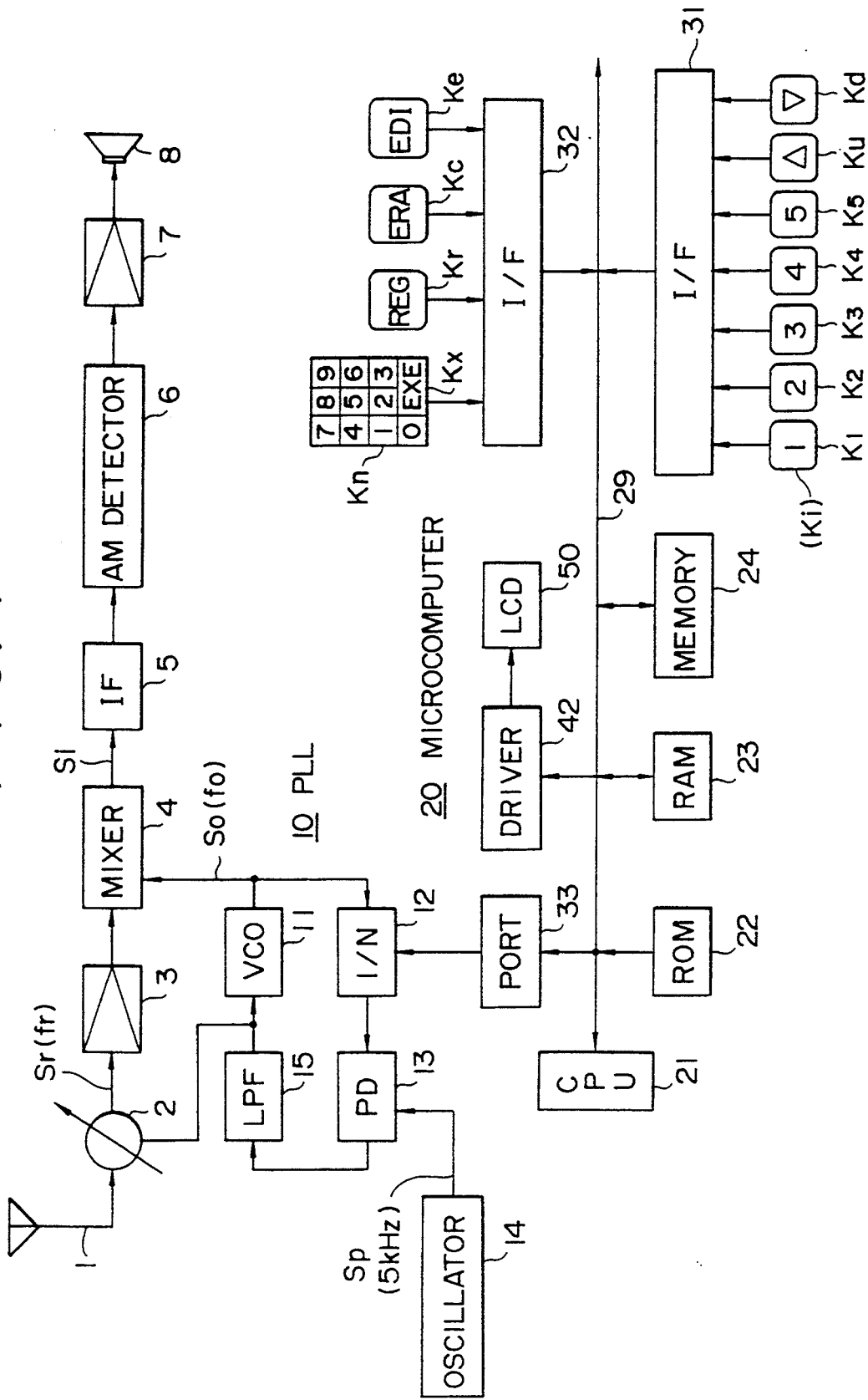
FIG. 1 is a system diagram of an example of the present invention.

Referring to FIG. 1, reference numerals 1 to 8 denote a receiver circuit of a synthesizer type, of which 1 denotes an antenna and 2 denotes an antenna tuner on an electronic tuning system. An AM broadcast wave signal Sr at a desired frequency fr is obtained by the tuner 2 and the signal Sr is supplied to a mixer 4 through a high-frequency amplifier 3. At the same time, an oscillated signal So whose frequency of is given by $$fo = fr + 450 \ [kHz] \quad (1)$$

is taken out from a VCO 11 and the signal So is supplied, as a local oscillator signal, to the mixer 4, and thereby, the signal Sr is frequency-converted to an intermediate-frequency signal (with an intermediate frequency of 450 kHz).

The intermediate-frequency signal is supplied to an AM detector 6 through an intermediate-frequency amplifier 5, from which an audio signal is taken out. This audio signal is supplied to a speaker 8 through a low-frequency amplifier 7.

In this case, the VCO 11 together with circuits 12 to 15 constitute a PLL 10. More specifically, the signal So from the VCO 11 is supplied to a variable frequency divider 12 and, therein, its frequency is divided by N. This divided-frequency signal is supplied to a phase comparator 13 and, at the same time, an oscillated signal Sp with a frequency of 5 kHz serving as a reference is taken out from an oscillator 14 and the signal Sp is supplied to the comparator 13. A comparison output from the comparator 13 is supplied to the VCO 11, as the control voltage therefor, through a low-pass filter 15. The output voltage of the filter 15 is also supplied to the tuner 2 as the channel selection voltage.

In a normal state, since the divided-frequency signal from the frequency divider 12 and the oscillated signal Sp have the same frequency, the frequency fo of the oscillated signal So becomes such that $$fo = 5[kHz] \times N \quad (2)$$

At this time, the expression (1) also holds.
Therefore, we obtain $$\begin{aligned} fr &= fo - 450 \\ &= 5 \times N - 450 \ [kHz]. \end{aligned}$$

Accordingly, if the frequency dividing ratio N is changed in increments of "1" within the range from 411 to 6089, the receive frequency fr can be varied in increments of 5 kHz over the range from 1605 kHz to 29995 kHz in accordance with the frequency dividing ratio N.

The frequency dividing ratio N is set in the frequency divider 12 by a microcomputer 20 for system controlling. Incidentally, as the microcomputer 20, the one-chip microcomputer M-37450 of MITSUBISHI ELECTRIC CORPORATION was used.

In the microcomputer 20, reference numeral 21 denotes for example a four-bit CPU, 22 denotes a ROM for storing processing routines, as shown in FIG. 2 to FIG. 4 and FIG. 8, etc., 23 denotes a RAM for the work area, and 24 denotes a memory in which a predetermined data table DTBL is written. These memories 22 to 24 are connected with the CPU 21 through a system bus 29.

Here, the memory 24 is provided by a nonvolatile memory, in which data stored therein can be erased and written electrically, such as an EEPROM (TRADENAME) or a memory backed up by a battery. The data table DTBL written in the memory 24 has for example such contents as shown in FIG. 5.

More specifically, the data table DTBL has a capacity of storing frequency data for 100 stations, for example, and formed of 20 pages in all, of which each page is divided into five addresses A1 to A5 for five stations. At each of the addresses A1 to A5 in each page, there is registered the frequency dividing ratio N for receiving the broadcasting at each frequency. The case shown in FIG. 5 is such that frequency dividing ratios N for five stations are registered in the first page, those for three stations are registered in the second page, and those for four stations are registered in the fifth page, and the remaining pages are all unregistered (N=0). Incidentally, although FIG. 5 shows the receive frequencies fr corresponding to the frequency dividing ratios N in parentheses, they are shown just for reference and not contained in the actual data table DTBL.

Referring to FIG. 1 again, reference numerals 31 and 32 denote key interfaces, 33 denotes an output port, 42 denotes an LCD driver, and 50 denotes an LCD for displaying frequencies, etc. These circuits 31 to 33 and 42 are also connected with the CPU 21 through the bus 29.

The key interface 31 is connected with select keys of five stations K1 to K5, a page-up key Ku, and a page-down key Kd, and the key interface 32 is connected with numeric keys Kn, an execute key Kx, a register key Kr, a delete key Kc, and an edit key Ke. These keys Ku to Ke are all formed of non-lock type push switches.

The page keys Ku and Kd are for selecting a page of the data table DTBL, while the select keys Ki (i=1 to 5) are for selecting a channel from a selected page and they are corresponding to the addresses A1 to A5 of the data table DTBL also as shown in FIG. 5. The numeric keys Kn and execute key Kx are keys for inputting a frequency by numerals, the register key Kr is that for registering a frequency, the delete key Kc is that for deleting some data in the data table DTBL, and the edit key Ke is that for switching modes of the receiver.

Figure 7:
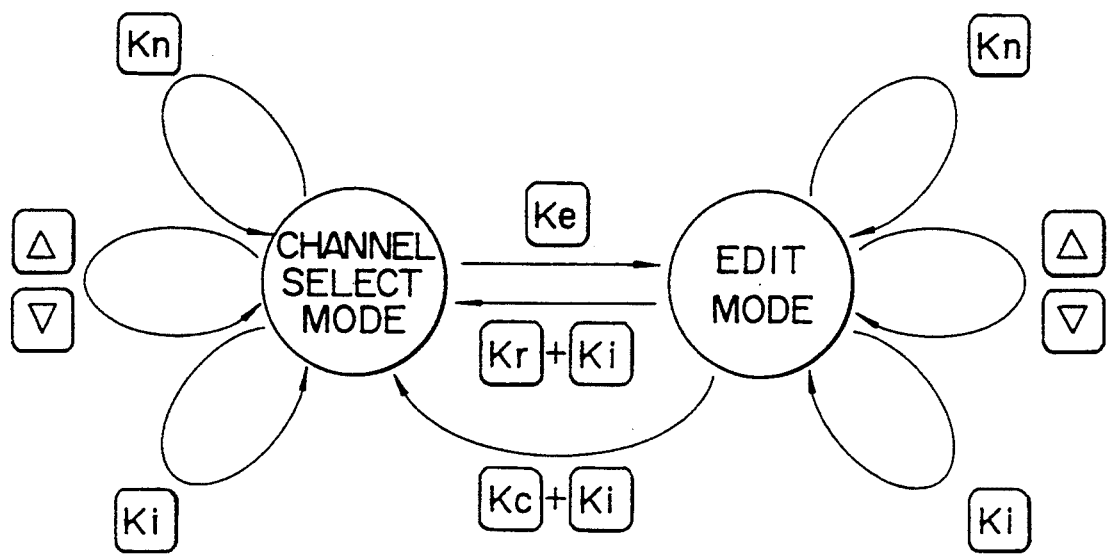
FIG. 7 is a state transition diagram showing operation of a receiver.

FIG. 7 is a state transition diagram corresponding to operations of the keys Ku to Ke. In the channel select mode, general channel selection from a page of the data table DTBL in which frequency data (frequency dividing ratios N) are registered can be made and also it becomes possible to register frequency data in the page in which frequency data are registered and in the page whose page number is the smallest of those of the pages in which no frequency data are registered.

In the edit mode, all of the pages of the data table DTBL become the object of channel selection, and registration or deletion of frequency data. Incidentally, a later described edit flag EDTF is set to "0" in the channel select mode and "1" in the edit mode.

Figure 6:
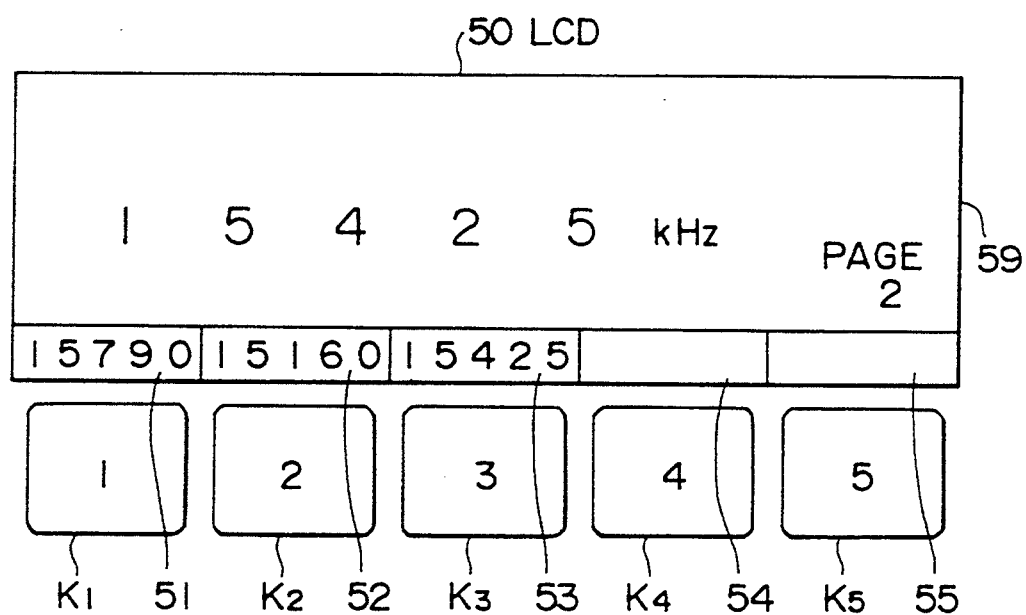
FIG. 6 is a diagram showing an example of a display of receive frequencies.
Figure 8:
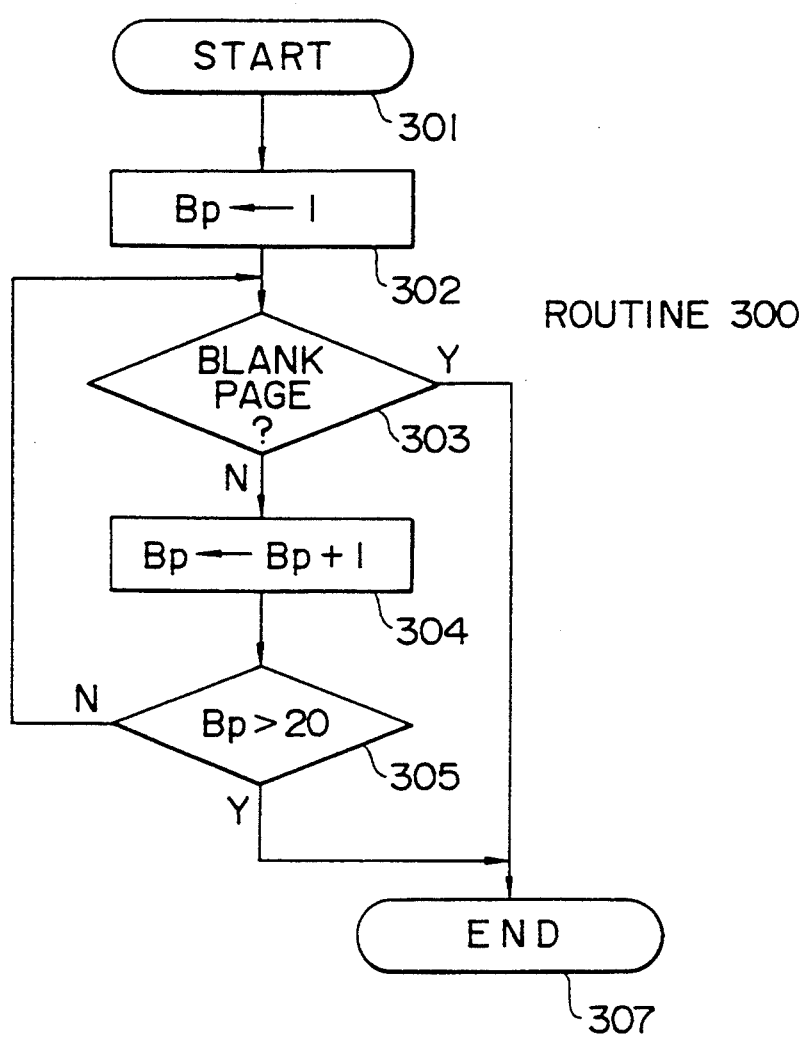
FIG. 8 is a diagram showing an example of a flow chart explanatory of the present invention.

FIG. 8 shows an example of the display screen of the LCD 50, which is in the form of a laterally elongated rectangle and separated into a wide display area 59 in the upper portion and five display areas 51 to 55 horizontally disposed in the remaining lower portion. In the areas 51 to 55, there are displayed frequencies of the broadcasting stations registered at the addresses A1 to A5, respectively, in the page selected from the 20 pages of the data table DTBL by the page key Ku or Kd, and in the area 59, there is shown the frequency which is currently received. FIG. 6 shows the case where the second page of the data table DTBL of FIG. 5 is selected and the frequency 15425 kHz at the address A3 is currently selected.

Further, as also shown in FIG. 6, the select keys K1 to K5 are disposed under the areas 51 to 55, In the RAM 23, there is provided a "Page Pointer Pn" which, when contents of a specific page of the data table DTBL are to be displayed on the LCD 50, designates the page. More specifically, when for example Pn=1, the frequency dividing ratios N registered in the first page of the data table DTBL are displayed in the areas 51 to 55 of the LCD 50.

Further, in the RAM 23, there is provided a "Smallest Blank Page Pointer Bp" designating the page whose page number is the smallest of those of the blank pages (in which no frequency dividing ratio N is registered) of the pages of the data table DTBL. For example, in the case of FIG. 5, Bp=3 because the third page, fourth page, and sixth pages to 20th pages are blank pages and the page whose page number is the smallest of those of the blank pages is the third page.

Figure 2:
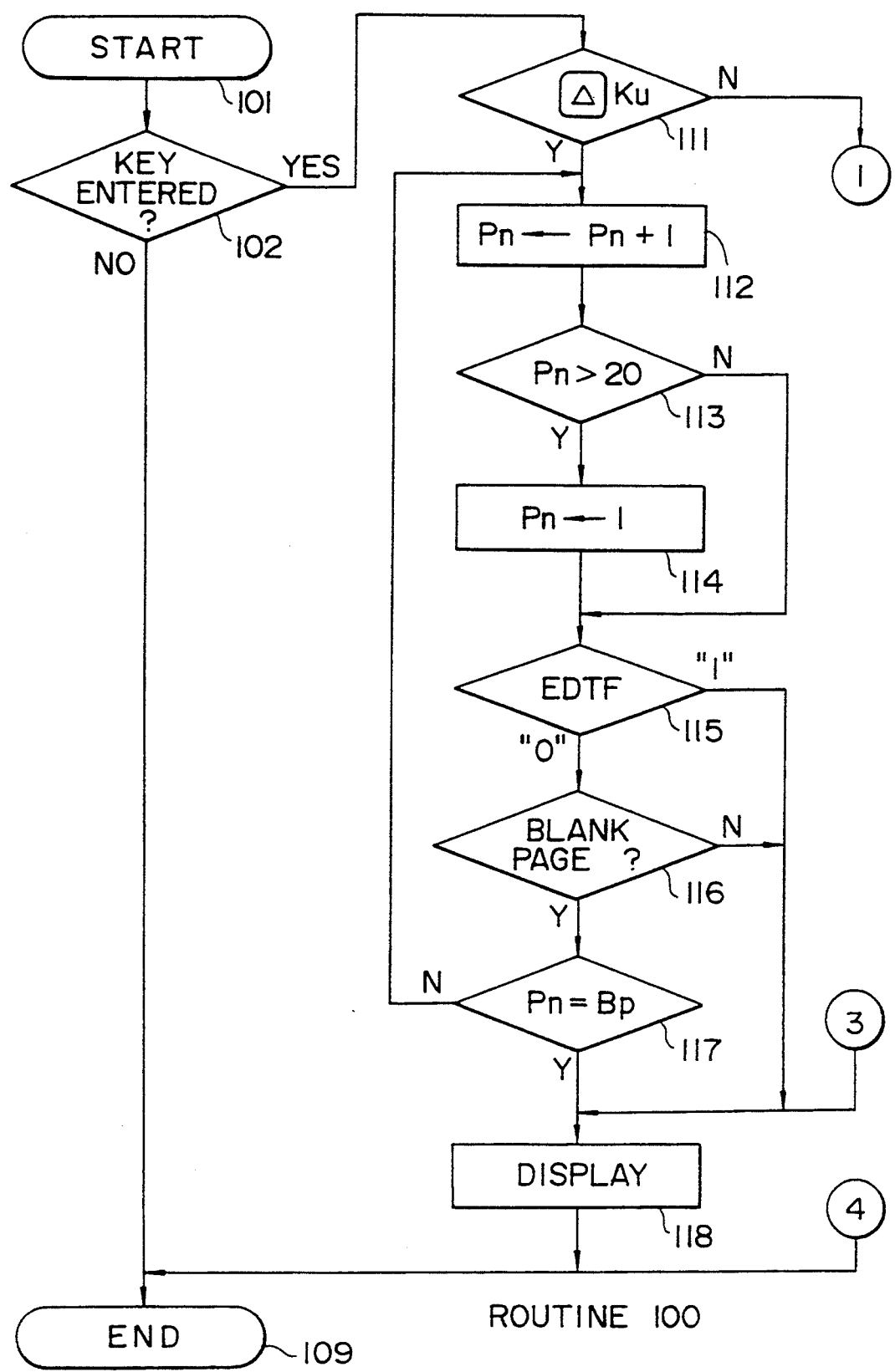
FIG. 2 is a diagram showing a portion of a flow chart relative to a first embodiment explanatory of the present invention.
Figure 3:
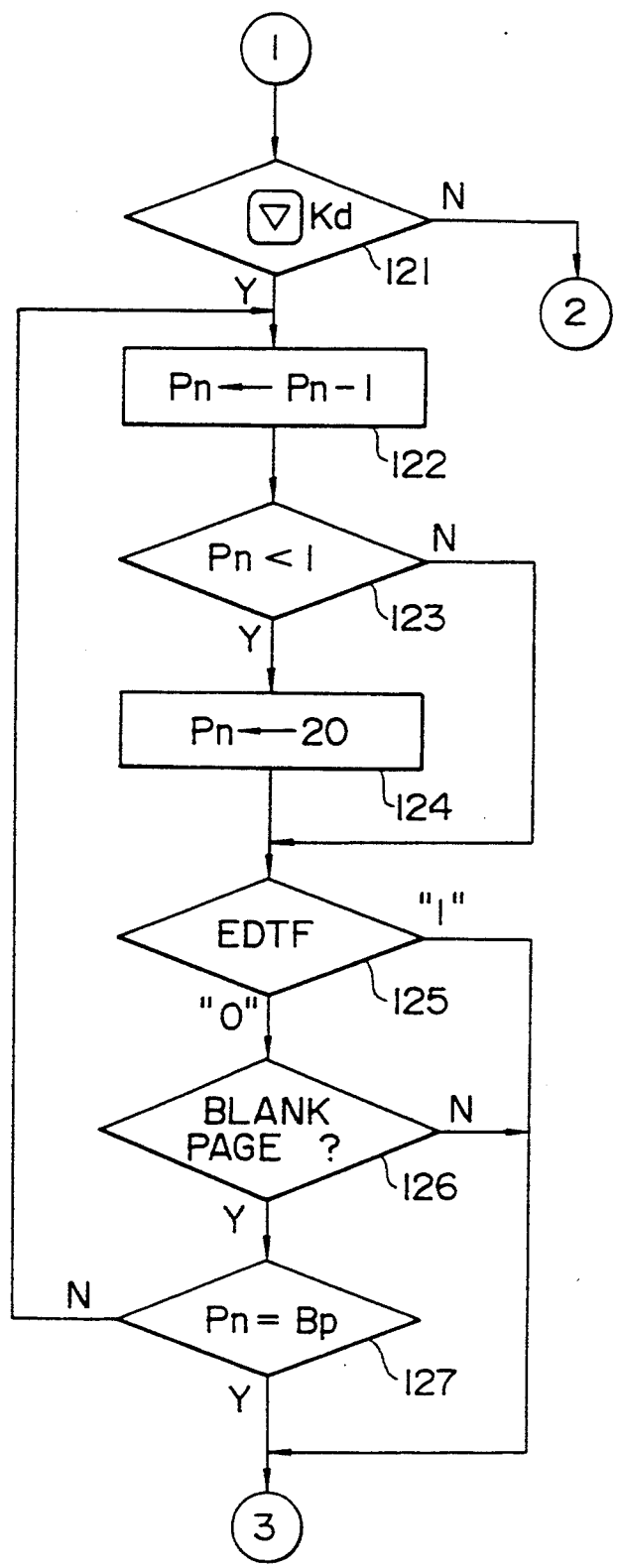
FIG. 3 is a diagram showing an example of a portion of a flow chart following FIG. 2.
Figure 4A:
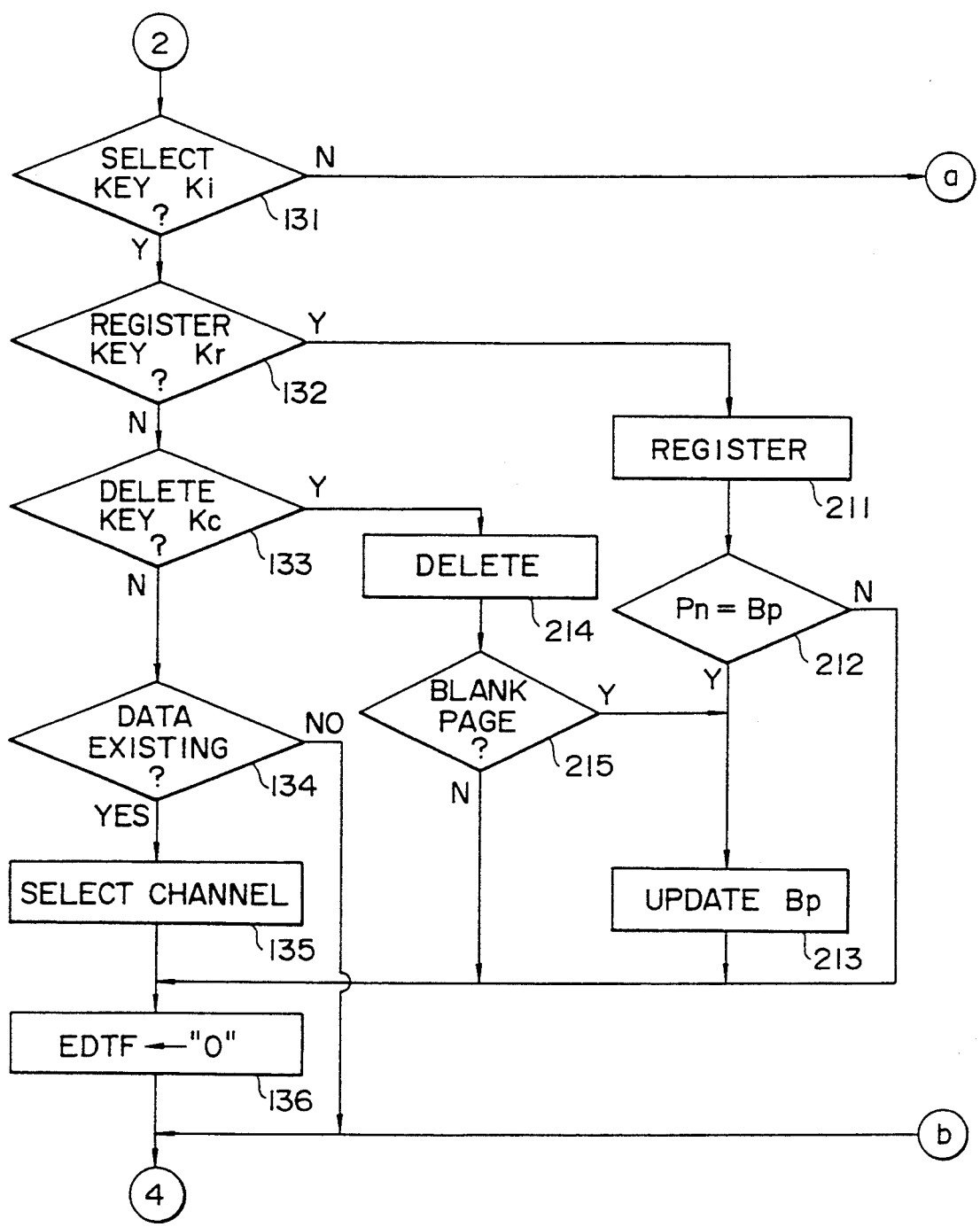
FIG. 4(a-b) is a diagram showing an example of a portion of a flow chart following FIG. 3.

Such processing as channel selection is made by the CPU 21 executing the routine 100 shown in FIG. 2 to FIG. 4 as described below. Incidentally, when frequency dividing ratios N (frequency data) are registered in the data table DTBL, the contents are as shown in FIG. 5.

<Entry with Keys>

The processing made by the CPU 21 is started in the step 101 of the routine 100. In the step 102, it is checked whether or not any of the keys Ku to Ke has been pushed. When none of the keys has been pushed, the processing is advanced from the step 102 to the step 109 and therein this routine 100 is ended.

If any of the keys Ku to Ke has been pushed, it is detected in the step 102 and the processing is advanced from the step 102 to the step 111. In this step 111, it is checked whether or not the pushed key is the page-up key Ku, and when it is not the page-up key Ku, the processing is advanced from the step 111 to the step 121.

Then, processing similar to that in the step 111 is made in the step 1El as to whether or not the pushed key is the page-down key Kd, in the step 131 as to whether or not the pushed key is the select key Ki, and in the step 141 as to whether or not the pushed key is the numeric key Kn. Further, in the step 151, it is checked whether or not the pushed key is the execute key Kx, and, in the step 161, it is checked whether or not the pushed key is the edit key Ke.

Thus, when a key has been pushed, it is checked what the pushed key is in the above steps.

<Forward Page Turning>

The forward page turning is made using the page-up key Ku. There are two cases in which the forward page turning is made:

① the case in the channel select mode (when EDTF="0"); and

② the case in the edit mode (when EDTF="1").

Description will be given below as to each of the cases.

① The case in the channel select mode (EDTF="0"):

In this case, all of the pages in which the frequency dividing ratio N is registered and the page with the smallest page number of those of the blank pages (the page designated by Bp) of the data table DTBL are sequentially displayed on the LCD 50 every time the page-up key Ku is pushed.

More specifically, when the page-up key Ku is pushed in this case, it is detected in the step 111, and then, the processing is forwarded from the step 111 to the step 112. In the step 112, the page pointer Pn is incremented by "1" and, in the step 113, it is checked whether or not the pointer Pn is over the maximum value "20", and when it is not over that, the processing is advanced from the step 113 to the step 115 skipping over the step 114.

When the page pointer Pn is over the maximum value "20" in the step 113, the processing is advanced from the step 113 to the step 114 and, in this step 114, the page pointer Pn is set to "1" and then the processing is advanced to the step 115.

Accordingly, in the incrementing of the page pointer Pn, it is arranged such that the 20th page is followed by the first page.

In the step 115, the edit flag EDTF is checked. Since EDTF="0" in this case, the processing is advanced from the step 115 to the step 116. In the step 116, it is checked whether or not the page of the data table DTBL designated by the page pointer Pn is a blank page, and when there is registered the frequency dividing ratio N of at least one station in this page, the processing is advanced from the step 116 to the step 118 skipping over the step 117.

In the step 118, all the frequency dividing ratios N registered in the page of the data table DTBL designated by the page pointer Pn are converted to data representative of frequencies and the data are transferred to the driver 42. Consequently, all of the frequencies of the broadcasting stations registered in the page designated by the page pointer Pn are displayed by the driver 42 in the areas 51 to 55 of the LCD 50.

In this case, since there are registered the frequency dividing ratios N in the data table DTBL as shown in FIG. 5, when Pn=1, the frequencies for the five stations registered in the first page of the data table DTBL are displayed in the areas 51 to 55 of the LCD 50. When Pn=2, the frequencies for the three stations registered in the second page of the data table DTBL are displayed in the areas 51 to 53 of the LCD 50 as shown in FIG. 6.

Then, with the processing in the step 109 made by the CPU 21, the routine 100 is ended.

When, in the step 116, there is registered no frequency dividing ratio N in the page of the data table DTBL designated by the page pointer Pn, the processing is advanced from the step 116 to the step 117. In this step 117, it is checked whether or not Pn=Bp, and when Pn=Bp, namely, when tile page designated by the page pointer Pn is the smallest blank page, the processing is advanced from the step 117 to the step 118. Since Bp=3 in the case of FIG. 5, the processing is advanced from the step 117 to the step 118 when Pn=3.

Then, in the step 118, the frequency dividing ratios N registered in the page designated by the smallest blank page pointer Bp of the data table DTBL (actually, non-registered data) are supplied to the LCD 50 and null data are displayed in the areas 51 to 55 of the LCD 50. In this case, the contents of the third page are displayed as space.

When Pn=Bp does not hold in the step 117, namely, when the page designated by the page pointer Pn is not the smallest blank page (though the page designated by the pointer Pn is a blank page in the step 116), the processing is returned from the step 117 to the step 112, with the step 118 not executed.

Thus, even when the page-up key Ku is pushed, the pages in which the frequency dividing ratio N is not at all registered, except the smallest blank page designated by the pointer Bp, are not displayed and the processing is advanced to the step for the following page.

Thus, when the page-up key Ku is pushed in the channel select mode, the pages of the data table DTBL in which the frequency dividing ratio N is registered are selected in the ascending sequence every time the page-up key Ku is pushed and the frequencies of the broadcasting stations registered in each page are displayed in the areas 51 to 55 of the LCD 50. At this time, the contents of the page with the smallest page number of those of the blank pages of the data table DTBL are also displayed as space in the areas 51 to 55, while all of the other blank pages are not displayed.

② The case in the edit mode (EDTF="1"):

In this case, all of the pages of the data table DTBL are displayed on the LCD 50 in the ascending sequence every time the page-up key Ku is pushed.

Namely, since EDTF="1" holds in the step 115 in this case, the processing is advanced from the step 115 to the step 118, with the step 117 skipped over.

Thus, in the edit mode, all the pages of the data table DTBL including blank pages are selected in the ascending sequence every time the page-up key Ku is pushed and the registered contents or state of registration in each page is displayed in the areas 51 to 55 of the LCD 50.

<Backward Page Turning>

The backward page turning is made using the page-down key Kd. There are also two cases in which the backward page turning is made:

① the case in the channel select mode (EDTF="0"); and

② the case in the edit mode (EDTF="1").

As compared with the processing in the case where the page-up key Ku is pushed, the processing in this case corresponds to that in ① and ② in the case of <Forward Page Turning>, only differing in that the direction of page turning is opposite, and since the processing in the steps 122 to 127 is similar to that in the steps 112 to 117, description of the same will be omitted.

It, however, should be noted here that the page pointer Pn is decremented by "1" in the step 122, it is checked whether or not the page pointer Pn has become smaller than the minimum value "1" in the step 123, and, when it has become smaller, the page pointer Pn is set to "20" in the step 124.

Thus, when the page-down key Kd is pushed in the channel select mode, the pages of the data table DTBL in which the frequency dividing ratio is registered are selected in the descending sequence every time the page-down key Kd is pushed and the frequencies of the broadcasting stations registered in each page are displayed in the areas 51 to 55 of the LCD 50. At this time, the contents of the blank page with the smallest page number of those of the blank pages of the data table DTBL are also displayed in the areas 51 to 55 as space, while all of the other blank pages are not displayed.

Meanwhile, in the edit mode, all the pages including blank pages of the data table DTBL are selected in the descending sequence every time the page-down key Kd is pushed and the registered contents or state of registration in each page is displayed in the areas 51 to 55 of the LCD 50.

What has been described in the foregoing can be summarized as follows:

① In the channel select mode, every time the page key Ku or Kd is pushed, the pages in which the frequency dividing ratio is registered are selected out of the data table DTBL in the ascending or descending sequence and the frequencies of the broadcasting stations registered in each page are displayed in the areas 51 to 55 of the LCD 50. At this time, the contents of the page with the smallest page number of those of the blank pages of the data table DTBL are also displayed in the areas 51 to 55, while all of the other blank pages are not displayed.

② In the edit mode, every time the page key Ku or Kd is pushed, all the pages including the blank pages of the data table DTBL can be selected in the ascending or descending sequence and the registered contents or state of registration in each page can be displayed in the areas 51 to 55 of the LCD 50.

Therefore, every time the page key Ku or Kd is pushed, a desired page can be selected out of the data table DTBL and the frequencies of all the broadcasting stations registered in the selected page or the state of registration in the page can be displayed in the areas 51 to 55 of the LCD 50. Thus, by the use of the page key Ku or Kd, the page in which the desired station is registered can be selected while confirming contents of each page on the LCD 50. Also, the page or address in which a broadcasting station is not registered in the data table DTBL can be found ascertained.

<Channel Selection by Select Key Ki>

This is the case where a channel selection is made using the select key Ki (and the page key Ku or Kd).

In this case, first, a desired frequency is displayed in one of the areas 51 to 55 of the LCD 50 by means of the above described <Forward Page Turning> or <Backward Page Turning> and, then, the select key Ki disposed below the area is pushed.

For example, when the frequency 15425 kHz at the address A3 in the second page shown in FIG. 5 is to be selected, the displayed state as shown in FIG. 6 is brought about by operating the page key Ku or Kd. Since the characters "15425 kHz" is displayed in the area 53, the select key K3 disposed below the area 53 is pushed.

Then, the fact that the select key Ki (the select key K3 in the present case) has been pushed is detected in the step 131 and the processing by the CPU 21 is advanced from the step 131 to the step 132, in which it is checked whether or not the register key Kr has been pushed. Since, in this case, the key has not been pushed, the processing is advanced from the step 132 to the step 133, and in this step 133, it is checked whether or not the delete key Kc has been pushed. Since, in the present case, the delete key Kc has not been pushed, the processing is advanced from the step 133 to the step 134.

In the step 134, it is checked whether or not the frequency dividing ratio N is registered at the address corresponding to the pushed select key Ki in the displayed page of the data table DTBL. When it is registered therein, the processing is advanced from the step 134 to the step 135, and in the step 135, the frequency dividing ratio N checked in the step 134, that is, the frequency dividing ratio N of the desired broadcasting station, is read from the data table DTBL, and the read frequency dividing ratio N is set in the frequency divider 12 through the port 33 and, at the same time, the frequency dividing ratio is converted to the data indicating the frequency and supplied to the driver 42.

Accordingly, the receive frequency is brought to the frequency corresponding to the frequency dividing ratio N set in the frequency divider 12 and, at the same time, the receive frequency is digitally displayed in the area 59 of the LCD 50°

In the present case, since the select key K3 has been pushed while the frequencies of the stations registered in the second page of the data table DTBL are displayed, the frequency dividing ratio "3175" registered at the address A3 in the second page is read out and set in the frequency divider 12. Thus, the frequency dividing ratio N in the frequency divider 12 is set to "3175" and, hence, the frequency 15425 kHz is set up as the receive frequency and, at the same time, characters "15425 kHz" are displayed in the area 59 of the LCD 50.

In the following step 136, the edit flag EDTF is reset to "0" and the processing is then advanced to the step 109.

Thus, a broadcasting station registered in the data table DTBL can be selected by the use of the page key Ku or Kd and select key Ki.

<Channel Selection by Numeric Keys Kn>

This is the case where a channel selection is made by directly inputting a desired receive frequency using the numeric keys Kn.

First, the numerals representing the frequency desired to received are input from the numeric keys Kn. More specifically, if the numeric keys Kn are pushed, the pushed numeral keys are detected in the step 141 and the processing is advanced from the step 141 to the step 142. In the step 142, the number corresponding to the numerals of the pushed keys of the numeric keys Kn is set in a register buffer BUFF prepared in the RAM 23 and then the processing is advanced to the step 109.

Therefore, when reception at the frequency "15425 kHz" is desired, for example, numerals "1, 5, 4, 2, 5" are sequentially input from the numeric keys Kn. Upon such key entries, the number "15425" is set in the register buffer BUFF.

After the entry of the frequency, the execute key Kx is pushed. Then, the fact that the execute key Kx has been pushed is detected in the step 151 and the processing is advanced from the step 151 to the step 152. In this step 152, the number indicating the frequency set in the register buffer BUFF is converted to the corresponding frequency dividing ratio N and, in the following step 153, the frequency dividing ratio N obtained as the result of the conversion is set in the frequency divider 12. Meanwhile, the number set in the register buffer BUFF is supplied to the driver 42. Then, the processing is advanced to the step 109.

Consequently, the broadcasting station with its frequency set in the register buffer BUFF is selected and, at the same time, the frequency is digitally displayed in the area 59 of the LCD 50. In the present case, since the number "15425" is set in the register buffer BUFF, the frequency 15425 kHz is selected and, at the same time, the frequency is displayed on the LCD 50.

Thus, by inputting the frequency of a desired broadcasting station using the numeric keys Kn and then pushing the execute key Kx, the broadcasting station with the input frequency can be selected.

<Registration of Frequency Dividing Ratio in Data Table DTBL>

This is the case where a new frequency dividing ratio N (receive frequency) is registered in the data table DTBL or to a select key Ki.

In this case, first, a frequency desired to be registered is selected by means of the above described <Channel Selection by Numeric Keys Kn> or <Channel Selection by Select Key Ki> and, then, the select key, of the select keys Ki, to which the frequency is desired to be registered is pushed while the register key Kr is depressed.

Then, the fact that the select key Ki has been pushed is detected in the step 131 and the processing is advanced from the step 131 to the step 132. Since, in this case, the register key Kr is also pushed down, the processing is advanced from the step 132 to the step 211 and, in this step 211, the frequency dividing ratio N set in the frequency divider 12 is registered at the address Ai corresponding to the select key Ki in the page selected by the page key Ku or Kd (the page designated by the pointer Pn) of the data table DTBL. At this time, if there is already registered a frequency dividing ratio N at the address Ai, it is overwritten by the new frequency dividing ratio N.

For example, if the register key Kr is pushed while the select key K5 is pushed down in the state where the second page of the data table DTBL is selected (Pn=2), the frequency dividing ratio N at that time is written at the address A5 in the second page of the data table DTBL.

Then, the processing is advanced to the step 212 and, in this step 212, it is checked whether or not Bn=Bp holds. When Bn=Bp, it means that the frequency dividing ratio N was registered in the blank page corresponding to the smallest blank page number in the step 211. Therefore, in this case, the smallest blank page pointer Bp must be updated.

Hence, when Bn=Bp, the processing is advanced from the step 212 to the step 213 and, in this step 213, the new smallest blank page number is searched for and the smallest blank page pointer Bp is updated to the new smallest blank page number obtained by the searching, and then, the processing is advanced to the step 109 through the step 136.

When Bn=Bp does not hold in the step 212, it is not necessary to update the smallest blank page pointer Bp and, hence, the processing is advanced from the step 212, through the step 136, to the step 109, with the step 213 skipped over.

Thus, through the above described key operations, any desired frequency data (frequency dividing ratio N)

can be registered in the data table DTBL or to a desired select key Ki. In this case, when the registration is made in a blank page, the smallest blank page pointer Bp is updated and, hence, when pages are turned over by the operation of the page key Ku or Kd, the renewed smallest blank page is displayed.

<Deletion of Frequency Dividing Ratio from Data Table DTBL>

This is the case where a frequency dividing ratio N already registered in the data table DTBL is deleted.

In this case, first, the broadcasting station desired to be deleted is selected by means of the above described <Channel Selection by Select Key Ki> and, then, the select key, of the select keys Ki, corresponding to the area (one of the areas 51 to 55) in which the frequency desired to be deleted is displayed is pushed while the delete key Kc is depressed.

Then, in the step 131, the fact that the select key Ki has been pushed is detected and the processing is advanced from the step 131 to the step 132, and the processing is further advanced from the step 132, through the step 133, to the step 214 because the delete key Kc is depressed in this case. In the step 214, the frequency dividing ratio N at the address Ai corresponding to the select key Ki in the page selected by the page key Ku or Kd (the page designated by the pointer Pn) out of the data table DTBL is deleted.

For example, if the delete key Kc is pushed while the select key K3 is pushed down in the state where the second page of the data table DTBL is selected (Pn=2), the frequency dividing ratio "3175" at the address A3 in the second page of the data table DTBL is deleted.

The processing is then advanced to the step 215 and, in this step 215, it is checked whether or not the page in which the deletion was made in the step 215 (the page designated by the pointer Pn) has become a blank page. When it has become a blank page, the processing is moved from the step 215 to the step 213, and therein, the smallest blank page pointer Bp is updated the same as described above. Thereafter, the processing is advanced to the step 109 through the step 136.

When the page has not become a blank page in the step 215, the processing is advanced from the step 215 to the step 109 through the step 136.

Thus, through the above described key operations, any desired frequency dividing ratio N registered in the data table DTBL can be deleted. In this case, if the page in which the deletion was made becomes a blank page, then the smallest blank page pointer Bp is updated and, hence, when pages are then turned over by operating the page key Ku or Kd, the renewed smallest blank page is displayed.

<Shifting to Edit Mode>

This is the case where the channel select mode is shifted to the edit mode.

In this case, the edit key Ke is pushed. Then, the fact that the edit key Ke has been pushed is detected in the step 161, and the processing is advanced from the step 161 to the step 162. Therein, the edit flag EDTF is set to "1", and then the processing is advanced to the step 109. The mode thereafter is shifted to the edit mode.

Since EDTF="0" when the step 136 is executed, the present edit mode is reset to the channel select mode when the select key Ki is pushed.

<Updating of the pointer Bp>

The routine 300 shown in FIG. 8 gives a particular example of the processing for updating the smallest blank page pointer Bp, namely, the processing in the step 213. This routine 300 is executed also when power for the receiver is turned on.

The routine 300 is started in the step 301 and, in the following step 302, the pointer Bp is set to "1". Then, in the step 303, it is checked whether or not the page of the data table DTBL designated by the pointer Bp is a blank page.

Then, if at least one frequency dividing ratio N is registered in the page designated by the pointer Bp, the processing is advanced from the step 303 to the step 304 and, in the step 304, the pointer Bp is incremented by "1". Then, in the step 305, it is checked whether or not. Bp>20 holds. When Bp≦20, the processing is returned from the step 305 to the step 303.

Therefore, the pages of the data table DTBL are sequentially checked from the first page as to whether or not each page is a blank page.

When a page designated by the pointer Bp is a blank page, for example when Bp=3 in the case shown in FIG. 5, it is detected in the step 303. The processing is then advanced from the step 303 to the step 307 and this routine is ended.

Therefore, in this case, the pointer Bp designates the smallest page number of the blank pages of the data table DTBL.

In the case where the frequency dividing ratio N is registered in all of the pages, Bp=21 holds in the step 304. Then, the fact that Bp=21 is determined in the step 305 and the processing is advanced from the step 305 to the step 307 and, therein, the present routine 300 is ended.

Accordingly, in the case where the registration of frequency dividing ratio N is made in all of the pages, Bp=21 holds.

Turning over of the pages, selection of the channel, registration and deletion of the frequency dividing ratio N, and shifting of the more can be made as described above, because the data table DTBL, in the above described embodiment, is divided into, for example, 20 pages and it is adapted such that each page can be selected by operating the page key Ku or Kd and the channel selection is achieved by selecting a frequency registered in the selected page by using the select key Ki. Therefore, a desired frequency can be quickly and simply selected even if there are registered a large number of frequencies. Further, it is not required to provide as many as 100 select keys.

Although the data table DTBL has apparently only a capacity of one page to display a set of frequency data therein, new frequency data can be additionally registered.

In the channel select mode, as described in ① above, when the page key Ku or Kd is pushed, the blank pages in which the frequency (frequency dividing ratio N) is not registered are not displayed and, therefore, a desired frequency can be selected quickly.

In the channel select mode, as described in ① above, when the page key Ku or Kd is pushed, it is adapted such that only the blank page with the smallest page number is displayed, and hence, it becomes possible to make the frequency registration in the blank page independently of the pages in which frequencies are already registered. For example, a singular broadcasting station which has been received by chance can be temporarily stored in the blank page.

In the edit mode, as described in ② above, all of the blank pages are displayed and it becomes possible to register a frequency in any page. Therefore, it is possible to divide the pages from page 1 to page 20 into some groups and use the pages of one group independently of the pages of another group. Accordingly, frequencies can be registered and managed by categorizing them into groups according to the taste of the user or purposes of the radio receiver.

In the above described arrangement, it is possible to provide a key or a dial for selecting characters and, in performing <Registration of Frequency Dividing Ratio in Data Table DTBL>, to select a character code indicative of the name of a broadcasting station, and to have the character code registered in the data table DTBL together with the data of the frequency dividing ratio N, such that the name of the station etc. are displayed on the LCD 50 together with the frequency by means of the character code registered as above.

In the above described first embodiment, it is adapted such that the blank page with the smallest page number only is displayed when the page key Ku or Kd is pushed in the channel select mode. However, it is also possible to arrange such that all the pages in which any frequency (frequency dividing ratio N) is not registered are skipped over when displaying pages as the page key Ku or Kd is pushed in the channel select mode so that a desired frequency is selected more quickly.

Example of such an arrangement will be described below as a second embodiment. While drawings showing the system diagram, data table, and state of display of receive frequencies are the same as FIG. 1, FIG. 5, and FIG. 6 for the first embodiment and, hence, detailed description of them will be omitted, the second embodiment is characterized in that the CPU 21 of the microcomputer 20 executes a routine 200 shown in FIG. 9 to FIG. 11.

FIG. 6 shows an example of the display screen of the LCD 50, which is in the form of a laterally elongated rectangle and separated into a wide display area 59 in the upper port[on and five display areas 51 to 55 horizontally disposed in the remaining lower portion. In the areas 51 to 55, there are displayed frequencies of the broadcasting stations registered at the addresses A1 to A5, respectively, in the page selected from the 20 pages of the data table DTBL by the page key Ku or Kd, and in the area 59, there is shown the frequency which is currently received. FIG. 6 shows the case where the second page of the data table DTBL is selected and the frequency 15425 kHz at the address A3 is currently selected.

Further, as also shown in FIG. 6, the select keys K1 to K5 are disposed under the areas 51 to 55.

Figure 9:
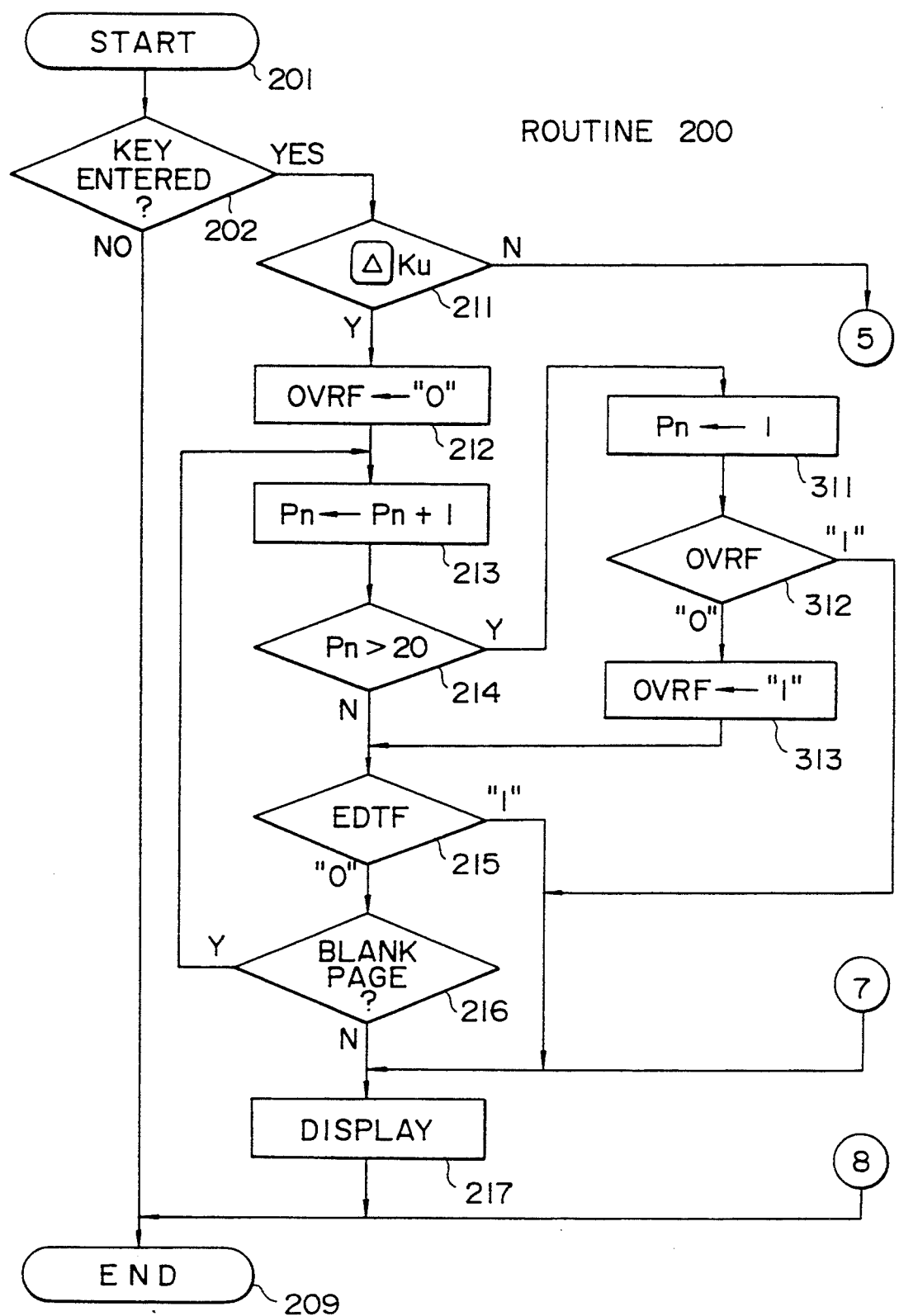
FIG. 9 is a diagram showing a portion of a flow chart relative to a second embodiment explanatory of the present invention.
Figure 10:
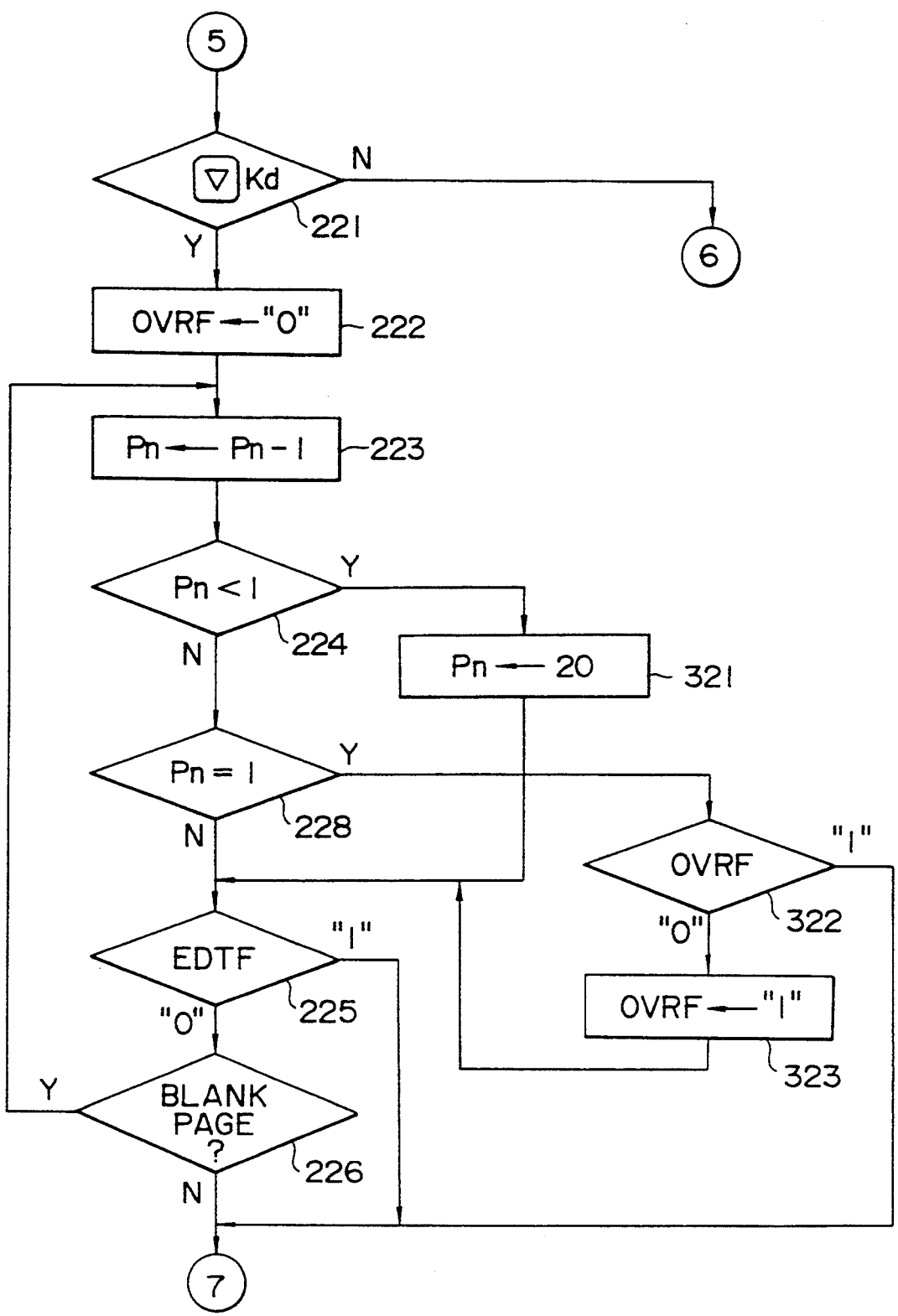
FIG. 10 is a diagram showing a portion of a flow chart following FIG. 9.

Such processing as channel selection is made by the CPU 21 executing the routine 200 shown in FIG. 9 to FIG. 11 as described below.

<Entry with Keys>

The processing by the CPU 21 is started in the step 201 of the routine 200. In the step 202, it is checked whether or not any key of the keys Ku to Ke has been pushed. When none of the keys has been pushed, the processing is advanced from the step 202 to the step 209 and therein this routine 200 is ended.

If any of the keys Ku to Ke has been pushed, it is detected in the step 202 and the processing is advanced from the step 202 to the step 211. In this step 211, it is checked whether or not the pushed key is the page-up key Ku, and when it is not the page-up key Ku, the processing is advanced from the step 211 to the step 221.

Then, processing similar to that in the step 211 is made in the step 221 as to whether or not the pushed key is the page-down key Kd, in the step 231 as to whether or not the pushed key is the select key Ki, and in the step 241 as to whether or not the pushed key is the numeric key Kn. Further, in the step 251, it is checked whether or not the pushed key is the execute key Kx and, in the step 261, it is checked whether or not the pushed key is the edit key Ke.

Thus, when a key has been pushed, it is checked what the pushed key is in the above steps.

<Forward Page Turning>

The forward page turning is made by pushing the page-up key Ku. There are three cases in which the forward page turning is made:

① the case in which EDTF="0" (the channel select mode) and OVRF="0" (there is registered the frequency dividing ratio N);

② the case in which EDTF="0" (the channel select mode) and OVRF="1" (there is registered no frequency dividing ratio N); and ③ the case in which EDTF="1" (the edit mode).

Description will be given below as to each of the above. Here, we assume that the contents of the data table DTBL are as shown in FIG. 5 when OVRF="0".

① The case in which EDTF="0" (the channel select mode) and OVRF="0" (there is registered the frequency dividing ratio N):

In this case, all of the pages, in which the frequency dividing ratio N is registered, of the data table DTBL are sequentially displayed on the LCD 50 every time the page-up key Ku is pushed.

More specifically, when the page-up key Ku is pushed in this case, it is detected in the step 211. Then, the processing is advanced from the step 211 to the step 212, and in this step 212, an over flag OVRF is reset to "0".

Then, in the step 213, the page pointer Pn designating a specific page of the data table DTBL is incremented by "1". Then, in the step 214, it is checked whether the page pointer Pn is over the maximum value "20". When it is not over the maximum value, the processing is advanced from the step 214 to the step 215. In this step 215, the edit flag EDTF is checked. Since EDTF="0" in this case, the processing is advanced from the step 215 to the step 216.

In the step 216, it is checked whether or not the page designated by the page pointer Pn of the data table DTBL is a blank page. If at least one frequency dividing ratio N is registered in the page, the processing is advanced from the step 216 to the step 217, and therein, all of the frequency dividing ratios N registered in the page designated by the page pointer Pn of the data table DTBL are converted to data indicative of the frequencies and the data are transferred to the driver 42. Consequently, all of the frequencies of the broadcasting stations registered in the selected page are displayed by the driver 42 in the areas 51 to 55 of the LCD 50.

Since, in this case, the frequency dividing ratios N are registered in the data table DTBL as shown in FIG. 5, when Pn=1, the frequencies of the five stations registered in the first page of the data table DTBL are displayed in the areas 51 to 55 of the LCD 50. When Pn=2, the frequencies of the three stations registered in the second page of the data table DTBL are displayed in the areas 51 to 53 of the LCD 50.

Then, with the processing in the step 209 made by the CPU 21, the routine 100 is ended.

Further, when no frequency dividing ratio N is registered in the page of the data table DTBL designated by the page pointer Pn as is the case with the third page shown in FIG. 5, the processing is returned from the step 216 to the step 213, without the step 217 executed. Thus, even when the page-up key Ku is pushed, the pages in which a frequency dividing ratio N is not at all registered are not displayed and the processing is advanced to the step for the following page.

Accordingly, every time the page-up key Ku is pushed, only the pages in which the frequency dividing ratio N is registered are selected in the ascending sequence and the frequencies of the broadcasting stations registered in each page are displayed in the areas 51 to 55 of the LCD 50, while those pages in which no frequency dividing ratio N is registered are not displayed.

As the pages are turned over and the page pointer Pn is incremented (as the page pointer Pn is incremented and the pages are turned over, to be exact) the page pointer Pn will exceed the maximum value "20" in the step 214.

Then, the processing is advanced from the step 214 to the step 311, and in the step 311, the page pointer Pn is set to "1". Then, in the step 312, the over flag OVRF is checked. Since OVRF="0" in the present case, the processing is advanced from the step 312 to the step 313, and in the step 313, the over flag OVRF is set to "1" and then the processing is advanced to the step 215.

Even if the over flag OVRF is set to "1" in the step 313, the over flag OVRF is reset to "0" when the page-up key Ku is pushed and the step 212 is executed, next time.

Accordingly, when the page-up key Ku is pushed, the first page appears next to the 20th page, and thereafter the above described processing is repeated from the first page.

Thus, if the frequency dividing ratio N is registered at all in the channel select mode, every time the page-up key Ku is pushed, only the pages in which the frequency dividing ratio N is registered are selected in the ascending sequence, with the frequencies of the broadcasting stations registered in each page displayed in the areas 51 to 55 of the LCD 50, while those pages in which the frequency dividing ratio N is not registered are not displayed.

② The case in which EDTF="0" (the channel select mode) and OVRF="1" (there is registered no frequency dividing ratio N):

This is the case where no frequency dividing ratio N is registered in the data table DTBL. In this case, even if the page-up key Ku is pushed over and over again, the first page of the LCD 50 remains displayed.

More specifically, since no frequency dividing ratio N is registered in the data table DTBL no matter what page the page pointer Pn designates in the step 216, the processing is repeated through the loop from the step 213 to the step 216 once the page-up key Ku is pushed.

When the state Pn="1" is brought about after some repetitions of the loop, the over flag OVRF is set to "1" in the step 313. When the state Pn="1" is brought about again after further repetitions of the loop, OVRF="1" holds this time. Hence, the processing is advanced from the step 312 to the step 217, and therein, the frequency dividing ratios N in the first page designated by the page pointer Pn of the data table DTBL, i.e., null data, are displayed in the areas 51 to 55 of the LCD 50.

Thus, when there is registered no frequency dividing ratio N at all in the data table DTBL in the channel select mode, the first page is selected or displayed.

③ The case in which EDTF="1" (the edit mode):

In this case, all of the pages of the data table DTBL are sequentially displayed on the LCD 50 every time the page-up key Ku is pushed.

More specifically, when OVRF="1" in this case, the processing is advanced from the step 312 to the step 217 skipping over the step 216. When OVRF="0", the processing is advanced from the step 312 to the step 215 through the step 313. Since EDTF="1" in this case in the step 215, the processing is advanced from the step 215 to the step 217 skipping over the step 216.

Accordingly, in the edit mode, all the pages of the data table DTBL are selected in the ascending sequence every time the page-up key Ku is pushed with the state of registration in each page displayed in the areas 51 to 55 of the LCD 50.

<Backward Page Turning>

The backward pages turning is made by pushing the page-down key Kd. There are also three cases in which the backward page turning is made:

① the case in which EDTF="0" (the channel select mode) and OVRF="0" (there is registered the frequency dividing ratio N);

② the case in which EDTF="0" (the channel select mode) and OVRF="1" (there is registered no frequency dividing ratio N); and ③ the case in which EDTF="1" (the edit mode).

The above mentioned cases are only different from the case where the page-up key Ku is pushed in that the direction of page turning is opposite and they correspond to ① to ③ n the case of <Forward Page Turning>.

① The case in which EDTF="0" (the channel select mode) and OVRF="0" (there is registered at least one frequency dividing ratio N):

In this case, only the pages, in which the frequency dividing ratio N is registered, of the data table DTBL are displayed in the descending sequence every time the page-down key Kd is pushed.

More specifically, when the page-down key Kd is pushed in this case, it is detected in the step 221 and the processing is advanced from the step 221 to the step 222, and in this step 222, the over flag OVRF is reset to "0".

Then, in the step 223, the page pointer Pn designating a specific page of the data table DTBL is incremented by "1". In the following step 224, it is checked whether or not the page pointer Pn is smaller than the minimum value "1". When it is "1" or above, the processing is advanced from the step 224 to the step 228, and in this step 228, it is checked whether or not the page pointer Pn is "1". When it is not "1", the processing is advanced from the step 228 to the step 225, and in this step 225, the edit flag EDTF is checked. Since EDTF="0" in the present case, the processing is advanced from the step 220 to the step 226.

In the step 226, it is checked whether or not the page designated by the page pointer Pn of the data table DTBL is blank. When the frequency dividing ratio N for at least one broadcasting station is registered therein, the processing is advanced from the step 226 to the step 217 and, therein, all of the frequency dividing ratios N registered in the page of the data table DTBL designated by the page pointer Pn are converted to data indicative of frequencies and the data are transferred to the driver 42. Consequently, the frequencies of all of the broadcasting stations registered in the selected page are displayed by the driver 42 in the areas 51 to 55 of the LCD 50.

Thereafter, with the processing in the step 209 made by the CPU 21, the routine 200 is ended.

When no frequency dividing ratio N is registered in the page of the data table DTBL designated by the page pointer Pn, the processing returns from the step 226 to the step 223, with the step 217 not executed. Accordingly, even if the page-down key Kd is pushed, the page in which no registration is made at all is not displayed and the processing is returned to the step 223 for the preceding page.

Thus, every time the page-down key Kd is pushed, only the pages in which the registration of the frequency dividing ratio N is made are selected in the descending sequence with the frequencies of the broadcasting stations registered in each page displayed in the areas 51 to 55 of the LCD 50, while those pages in which no frequency dividing ratio N is registered are not displayed.

As the pages are selected in the descending sequence and the page pointer Pn is decremented (as the page pointer Pn is decremented and the pages are selected in the descending sequence, to be exact), the page pointer Pn will become the minimum value "1" in the step 228.

Then, the processing is advanced from the step 228 to the step 322, and in this step 322, the over flag OVRF is checked. Since OVRF="0" in this case, the processing is advanced from the step 322 to the step 323, and in this step 323, the over flag OVRF is set to "1" and then the processing is advanced to the step 225.

Incidentally, even if the over flag OVRF is set to "1" in the step 323, the flag OVRF is reset to "0" when the page-down key Kd is pushed and the step 222 is executed, next time.

When the step 223 is executed in the state of Pn=1, the state Pn<1 is brought about in the step 224. Hence, the processing is advanced from the step 224 to the step 321, and in this step 321, the page pointer Pn is set to "20" and then the processing is advanced to the step 225.

Accordingly, when the page-down key Kd is pushed, the 20th page appears next to the first page, and thereafter the above described processing is repeated from the 20th page.

Thus, in the channel select mode, if the frequency dividing ratio N is registered at all in the data table DTBL, the pages in which the frequency dividing ratio N is registered are selected in the descending sequence every time the page-down key Kd is pushed with the frequencies of the broadcasting stations registered in each page displayed in the areas 51 to 55 of the LCD 50, while the pages in which no registration of the frequency dividing ratio N is made are not displayed.

② The case in which EDTF="0" (the channel select mode) and OVRF="1" (there is registered no frequency dividing ratio N):

In this case, since the frequency dividing ratio N is not registered in the data table DTBL no matter what page the page pointer Pn designates, the processing in the loop from the step 223 to the step 226 is repeated once the page-up key Ku is pushed.

When the state Pn=1 is reached after the repetition of the loop, the over flag OVRF is set such that OVRF="1" in the step 323, and when the loop is further repeated and the state Pn=1 is reached once again, the over flag OVRF is "1" this time. Hence, the processing advances from the step 322 to the step 217, and therein, the frequency dividing ratios N in the first page of the data table DTBL designated by the page pointer Pn, i.e., null data, are displayed in the areas 51 to 55, of the LCD 50.

Accordingly, when no frequency dividing ratio N is registered in the data table DTBL in the channel select mode, the first page of the data table DTBL is selected or displayed.

③ The case in which EDTF="1" (the edit mode):

In this case, all of the pages of the data table DTBL are displayed on the LCD 50 in the descending sequence every time the page-down key Kd is pushed.

More specifically, when OVRF="1" in this case, the processing is advanced from the step 322 to the step 217, with the step 226 skipped over. When OVRF="0", the processing is advanced from the step 322 to the step 225 through the step 323. Since EDTF="1" in the step 225 in the present case, the processing is advanced from the step 225 to the step 217, with the step 226 skipped over.

Accordingly, in the edit mode, every time the page-down key Kd is pushed, all of the pages of the data table DTBL are selected in the descending sequence and the state of registration in each page is displayed in the areas 51 to 55 of the LCD 50.

What has been described above can be summarized as follows:

① In the channel select mode and when there is registered the frequency dividing ratio N at all in the data table DTBL, every time the page key Ku or Kd is pushed, only the pages in which the frequency dividing ratio N is registered are selected in the ascending sequence or descending sequence and the frequencies of the broadcasting stations registered in each page are displayed in the areas 51 to 55 of the LCD 50, while the pages in which no frequency dividing ratio N is registered are not displayed.

② In the channel select mode and when there is registered no frequency dividing ratio N at all in the data table DTBL, the first page of the data table DTBL is selected or displayed.

③ In the edit mode, every time the page key Ku or Kd is pushed, all of the pages of the data table DTBL are selected in the ascending sequence or descending sequence and the state of registration in each page is displayed in the areas 51 to 55 of the LCD 50.

Accordingly, each time the page key Ku or Kd is pushed, any desired page of the data table DTBL can be selected and the frequencies of the broadcasting stations registered in the selected page or the state of the registration in the selected page can be displayed in the areas 51 to 55 of the LCD 50. Thus, by the use of the page key Ku or Kd, the page in which a desired broadcasting station is registered can be selected while confirming each page on the LCD 50, or the page or address at which any broadcasting station is not registered in the data table DTBL can be ascertained.

<Channel Selection by Select Key Ki>

This is the case where a channel selection is made using the select key Ki (and the page key Ku or Kd).

In this case, first, the desired frequency is displayed in one of the areas 51 to 55 of the LCD 50 according to the above described <Forward Page Turning> or <Backward Page Turning> and, then, the select key Ki disposed below the area is pushed.

For example, when the frequency 15425 kHz at the address A3 in the second page shown in FIG. 5 is to be selected, the displayed state as shown in FIG. 6 is brought about by operating the page key Ku or Kd. Since the characters "15425 kHz" is displayed in the area 53, the select key K3 disposed below the area 53 is pushed.

Figure 11A:
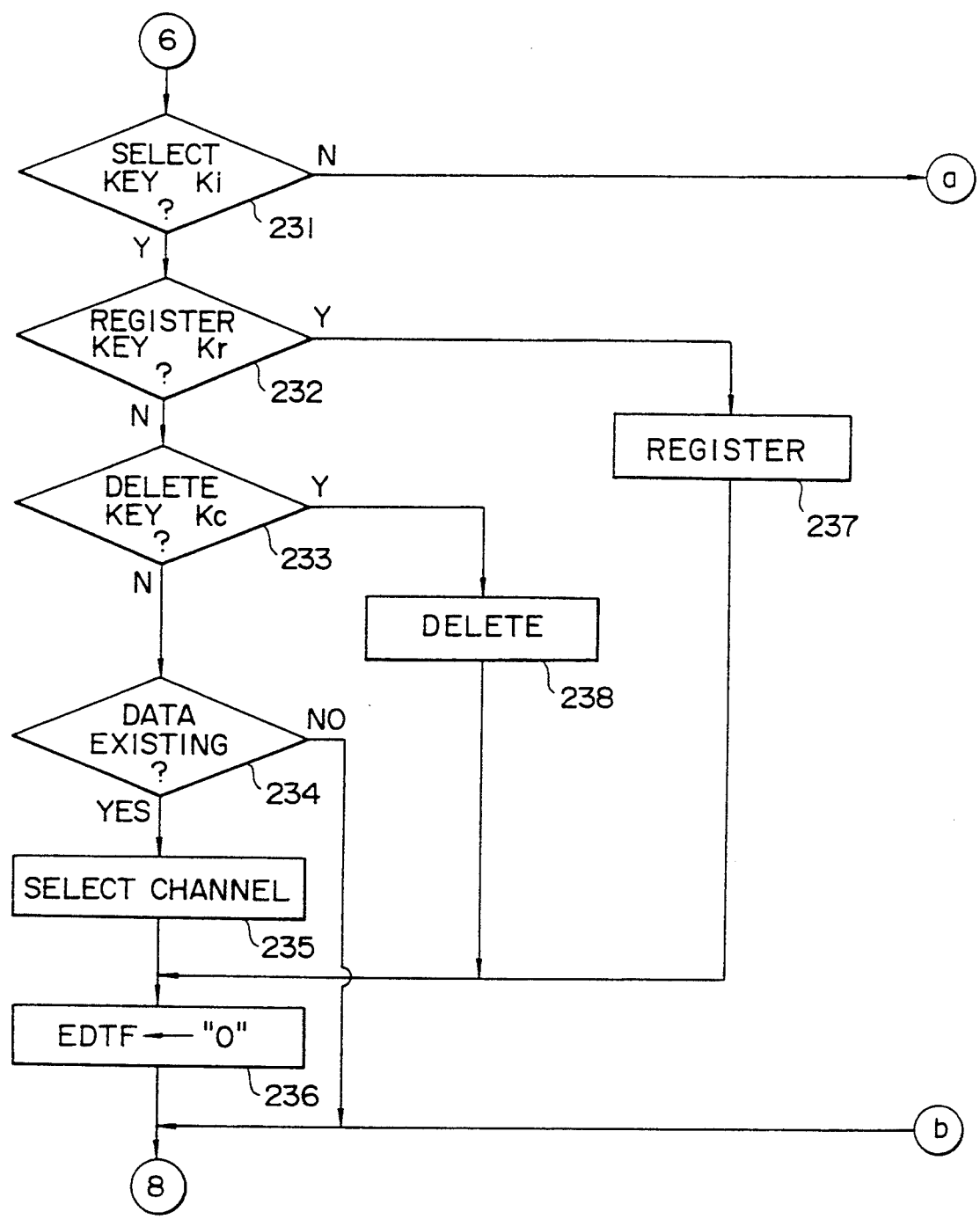
FIG. 11(a-b) is a diagram showing a portion of a flow chart following FIG. 10.

Then, the fact that the select key Ki (the select key K3 in the present case) has been pushed is detected in the step 231 FIG. 11 and the processing by the CPU 21 is advanced from the step 231 to the step 232, in which it is checked whether or not the register key Kr has been pushed. Since, in this case, the key has not been pushed, the processing is advanced from the step 232 to the step 233, and in this step 233, it is checked whether or not the delete key Kc has been pushed. Since, in the present case, the key has not been pushed, the processing is advanced from the step 233 to the step 234.

In the step 234, it is checked whether or not frequency dividing ratio N is registered at the address corresponding to the pushed select key Ki in the displayed page of the data table DTBL. When it is registered, the processing is advanced from the step 234 to the step 235, and in the step 235, the frequency dividing ratio N checked in the step 234, that is, the frequency dividing ratio N of the desired broadcasting station, is read from the data table DTBL, and the read frequency dividing ratio N is set in the frequency divider 12 through the port 33 and, at the same time, it is converted to the data indicating the frequency and supplied to the driver 42.

Accordingly, the receive frequency is brought to the frequency corresponding to the frequency dividing ratio N set in the frequency divider 12 and, at the same time, the receive frequency is digitally displayed in the area 59 of the LCD 50.

In the present case, since the select key K3 has been pushed while the frequencies of the stations registered in the second page of the data table DTBL are displayed, the frequency dividing ratio "3175" registered at the address A3 in the second page is read and set in the frequency divider 12. Thus, the frequency dividing ratio N in the frequency divider 12 is set to "3175" and, hence, the frequency 15425 kHz is set up as the receive frequency and, at the same time, characters "15425 kHz" are displayed in the area 59 of the LCD 50.

In the following step 236, the edit flag EDTF is reset to "0" and the processing is then advanced to the step 209.

Thus, a broadcasting station registered in the data table DTBL can be selected by the use of the page key Ku or Kd and the select key Ki.

<Channel Selection by Numeric Keys Kn>

This is the case where a channel selection is made by inputting a desired receive frequency directly using the numeric keys Kn.

First, the numerals representing the frequency desired to be received are input from the numeric keys Kn. More specifically, if the numeric keys Kn are pushed, the pushed numeral keys are detected in the step 241 and the processing is advanced from the step 241 to the step 242. In the step 242, the number corresponding to the numerals of the pushed keys of the numeric keys Kn is set in a register buffer BUFF prepared in the RAM 23 and then the processing is advanced to the step 209.

Therefore, when reception of the frequency "15425 kHz" is desired, for example, numerals "1, 5, 4, 2, 5" are sequentially input from the numeric keys Kn. Upon such key entries, the number "15425" is set in the register buffer BUFF.

After the entry of the frequency, the execute key Kx is pushed. The fact that the execute key Kx has been pushed is detected in the step 251 and the processing is advanced from the step 251 to the step 252. In this step 252, the number indicating the frequency set in the register buffer BUFF is converted to the corresponding frequency dividing ratio N and, in the following step 253, the frequency dividing ratio N obtained as the result of the conversion is set in the frequency divider 12. Further, the number set in the register buffer BUFF is supplied to the driver 42. Then, the processing is advanced to the step 209.

Consequently, the broadcasting station with the frequency set in the register buffer BUFF is selected and the frequency is digitally displayed in the area 59 of the LCD 50. In the present case, since the number "15425" is set in the register buffer BUFF, the frequency 15425 kHz is selected and, at the same time, the frequency is displayed on the LCD 50.

Thus, by inputting the frequency of a desired broadcasting station using the numeric keys Kn and then pushing the execute key Kx, the broadcasting station with the input frequency can be selected.

<Registration of Frequency Dividing Ratio in Data Table DTBL>

This is the case where a new frequency dividing ratio N (receive frequency) is registered in the data table DTBL or to a select key Ki.

In this case, first, the frequency desired to be registered is selected by means of the above described <Channel Selection by Numeric Keys Kn> or <Channel Selection by Select Key Ki> and, then, the select key, of the select keys Ki, to which the frequency is desired to be registered is pushed while the register key Kr is depressed.

Then, the fact that the select key Ki has been pushed is detected in the step 231 and the processing is advanced from the step 231 to the step 232. Since, in this case, the register key Kr is also pushed down, the processing is advanced from the step 232 to the step 237 and, in this step 237, the frequency dividing ratio N set in the frequency divider 12 is registered at the address Ai corresponding to the select key Ki in the page selected by the page key Ku or Kd out of the data table DTBL (the page designated by the pointer Pn). At this time, if there is already registered a frequency dividing ratio N at the address Ai, it is overwritten by the new frequency dividing ratio N.

For example, if the register key Kr is pushed while the select key K5 is pushed down in the state where the second page of the data table DTBL is selected (Pn=2), the frequency dividing ratio N at that time is written at the address A5 in the second page of the data table DTBL.

Thereafter, the processing is advanced, through the step 236, to the step 209.

Thus, through the above described key operations, any desired frequency data (frequency dividing ratio N)

can be registered in the data table DTBL or to a desired select key Ki.

<Deletion of Frequency Dividing Ratio from Data Table DTBL>

This is the case where a frequency dividing ratio N already registered in the data table DTBL is deleted.

In this case, first, the broadcasting station desired to be deleted is selected by means of the above described <Channel Selection by Select Key Ki> and, then, the select key, of the select keys Ki, corresponding to the area (one of the areas 51 to 55) in which the frequency desired to be deleted is displayed is pushed while the delete key Kc is depressed.

Then, in the step 231, the fact that the select key Ki has been pushed is detected and the processing is advanced from the step 231 to the step 232, and the processing is further advanced from the step 232, through the step 233, to the step 238 because the delete key Kc is depressed in this case. In the step 238, the frequency dividing ratio N at the address Ai corresponding to the select key Ki in the page selected by the page key Ku or Kd (the page designated by the pointer Pn) out of the data table DTBL is deleted.

For example, if the delete key Kc is pushed while the select key K3 is pushed down in the state where the second page of the data table DTBL is selected (Pn=2), the frequency dividing ratio "3175" at the address A3 in the second page of the data table DTBL is deleted.

Thereafter, the processing is advanced to the step 209 through the step 236.

Thus, through the above described key operations, any desired frequency dividing ratio N registered in the data table DTBL can be deleted.

<Shifting to Edit Mode>

This is the case where the channel select mode is shifted to the edit mode.

In this case, the edit key Ke is pushed. Then, the fact that the edit key Ke has been pushed is detected in the step 261, and the processing is advanced from the step 261 to the step 262. Therein, the edit flag EDTF is set to "1" and then the processing is advanced to the step 209. The mode thereafter is shifted to the edit mode.

Since EDTF is reset to "0" when the step 236 is executed, the present edit mode is reset to the channel select mode when the select key Ki is pushed.

What is claimed is:

1. A radio receiver of a synthesizer type having a PLL adapted to perform frequency conversion of a received signal using an oscillated signal from said PLL to thereby achieve channel selection comprising:
   a microcomputer with a central processing unit, a plurality of memories and a display driver means;
   a data table divided into a plurality of pages and stored in one of said plurality of memories having frequency data for making a channel selection registered therein;
   each of said plurality of pages being assigned with a page number;
   display means connected to said display driver means of said microcomputer;
   a page key for sequentially selecting a page from said plurality of pages;
   a plurality of select keys for selecting the frequency data from a page; and
   a register key for writing the frequency data into addresses of said data table;
   said page key, said plurality of select keys, and said register key adapted to provide input to said microcomputer;
   wherein every time said page key is operated in a first mode, each of the plurality of pages of said data table is sequentially selected by said central processing unit of said microcomputer and when said data table includes among said plurality of pages a plurality of blank pages having no data registered therein, all but one of said plurality of blank pages having no data are skipped over by said central processing unit of said microcomputer.
   every time said page key is operated in a second mode, all pages of the plurality of pages of said data table including said plurality of blank pages are sequentially selected by said central processing unit of said microcomputer and
   contents of each of the selected pages in the first and second mode are converted to a frequency format by said display driver means of said microcomputer and supplied to said display means to that the contents of said each of the selected pages are displayed on said display means in said frequency format, and wherein
   in both said first and second modes when one select key of said plurality of select keys is operated, the frequency data registered at an address corresponding to said operated select key in the page selected by said page key is read from the address by said central processing unit of said microcomputer,
   a received frequency is set up by said central processing unit of said microcomputer according to the read frequency data, and
   when said register key and said one select key of said plurality of select keys are operated, the frequency data of the frequency which is currently received is written at the address corresponding to said operated select key in the page selected by said page key by said central processing unit of said microcomputer.

2. A radio receiver according to claim 1, wherein, every time said page key is operated in the first mode, all of the pages in which the frequency data is registered and one page of of said plurality of blank pages in which no data is registered are sequentially selected by said central processing unit and displayed on said display means by said display driver means after conversion to said frequency format.

3. A radio receiver according to claim 1, wherein every time said page key is operated in the first mode, all of the pages in which the frequency data is registered and one page having the smallest page number among said plurality of blank pages in which no data is registered are sequentially selected by said central processing unit of said microcomputer and displayed on said display means by said display driver means of said microcomputer after conversion to said frequency format.

4. A method of achieving channel selection with a radio receiver of a synthesizer type comprising the steps of:
   sequentially selecting in a first mode each of a plurality of pages of a data table;
   skipping over all but one of said selected pages of said data table having no data registered therein;
   displaying said selected plurality of pages of said data table which have not been skipped over;

sequentially selecting in a second mode all pages of the plurality of pages of said data table including said pages of said data table having no data registered therein;

converting data of each of the selected pages in said first and second modes to a frequency format;

displaying said data converted to said frequency format, so that the contents of each of the selected pages are displayed in said frequency format;

selecting one frequency from said displayed data converted to said frequency format;

operating a select key and reading said data of said data table from an address in said data table corresponding to said selected one frequency;

setting up a received frequency according to said read data;

operating a register key and said select key; and writing the frequency currently received at an address corresponding to said operated register key and said operated select key.

* * * * *

UNITED STATES PATENT AND TRADEMARK OFFICE
CERTIFICATE OF CORRECTION

PATENT NO. : 5,355,527

DATED : October 11, 1994

INVENTOR(S) : Masanao Owaki

Page 1 of 2

It is certified that error appears in the above-indentified patent and that said Letters Patent is hereby corrected as shown below:

On the title page:

In the Title, change "Radio Receiver with Display Memory and Keys for Displaying Selecting, and Storing Station Frequencies" to --Radio Receiver with Display, Memory, and Keys for Displaying, Selecting, and Storing Station Frequencies--

In the Abstract, line 5, after "selection" insert --consisting of:--

Col. 3, line 21, change "of" to --fo--

Col. 5, line 3, change "Fig. 8" to --Fig. 6--
        line 18, change "55," to --55.--
        line 58, change "1E1" to --121--

Col. 7, line 1, change "tile" to --the--

Col. 9, line 24, change "50°" to --50.--
        line 48, after "to" insert --be--

Col. 11, line 11, change "deleted ." to --deleted.--

UNITED STATES PATENT AND TRADEMARK OFFICE
CERTIFICATE OF CORRECTION

PATENT NO. : 5,355,527
DATED : October 11, 1994
INVENTOR(S) : Masanao Owaki

It is certified that error appears in the above-indentified patent and that said Letters Patent is hereby corrected as shown below:

```
Col. 12, line 17, delete "." second occurrence
         line 42, change "more" to --mode--
Col. 16, line 41, change "n" to --in--
         line 65, change "220" to --225--
Col. 18, line 11, after "55" delete ","
Col. 19, line 15, after "231" insert --of--

Col. 22, line 12, change "." to --,--
```

Signed and Sealed this

Thirteenth Day of June, 1995

Attest:

BRUCE LEHMAN

*Attesting Officer*    Commissioner of Patents and Trademarks